United States Patent
Brick et al.

(10) Patent No.: US 11,127,779 B2
(45) Date of Patent: Sep. 21, 2021

(54) LIGHT-EMITTING SEMICONDUCTOR CHIP AND DISPLAY DEVICE

(71) Applicant: OSRAM OLED GmbH, Regensburg (DE)

(72) Inventors: Peter Brick, Regensburg (DE); Hubert Halbritter, Dietfurt (DE); Mikko Perälä, Tampere (FI); Frank Singer, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/633,826

(22) PCT Filed: Jul. 31, 2018

(86) PCT No.: PCT/EP2018/070736
§ 371 (c)(1),
(2) Date: Jan. 24, 2020

(87) PCT Pub. No.: WO2019/025442
PCT Pub. Date: Feb. 7, 2019

(65) Prior Publication Data
US 2020/0273907 A1 Aug. 27, 2020

(30) Foreign Application Priority Data

Aug. 2, 2017 (DE) .......................... 102017117540.7

(51) Int. Cl.
*H01L 27/15* (2006.01)
*H01L 25/16* (2006.01)
*H01L 33/50* (2010.01)

(52) U.S. Cl.
CPC .......... *H01L 27/156* (2013.01); *H01L 25/167* (2013.01); *H01L 33/50* (2013.01)

(58) Field of Classification Search
CPC ..... H01L 27/156; H01L 33/50; H01L 25/167; H01L 33/504
See application file for complete search history.

(56) References Cited

U.S. PATENT DOCUMENTS 10,432,924 B2    10/2019  Zhao et al.
2010/0039698 A1   2/2010  Robinson et al.
(Continued)

FOREIGN PATENT DOCUMENTS

GB    2403863 A     1/2005
WO    2017092453 A1  6/2017

*Primary Examiner* — Changhyun Yi
(74) *Attorney, Agent, or Firm* — Slater Matsil, LLP (57) ABSTRACT

A light-emitting semiconductor chip and a display device are disclosed. In an embodiment a light-emitting semiconductor chip includes an emission surface formed with a plurality of first emission regions and second emission regions, wherein the first emission regions and the second emission regions are configured to emit light of a predeterminable color location, wherein the first and second emission regions are separately controllable from each other, wherein the first emission regions and second emission regions are arranged next to one another in a first plane, wherein all second emission regions form at least a part of an outer edge of the emission surface, and wherein the first emission regions have a smaller extent than the second emission regions along at least one direction lying in the first plane.

17 Claims, 5 Drawing Sheets

(56) References Cited

U.S. PATENT DOCUMENTS

| | | |
|---|---|---|
| 2010/0109575 A1 | 5/2010 | Ansems et al. |
| 2012/0075839 A1 | 3/2012 | Takada |
| 2013/0241964 A1 | 9/2013 | Ohyama et al. |
| 2014/0247597 A1* | 9/2014 | Abe .......................... F21K 9/64 362/249.06 |
| 2016/0050409 A1 | 2/2016 | Park et al. |
| 2017/0023708 A1 | 1/2017 | Zhou et al. |
| 2017/0133348 A1* | 5/2017 | Shido ................. H01L 51/5271 |
| 2017/0272738 A1 | 9/2017 | Zhao et al. |

* cited by examiner

LIGHT-EMITTING SEMICONDUCTOR CHIP AND DISPLAY DEVICE

This patent application is a national phase filing under section 371 of PCT/EP2018/070736, filed Jul. 31, 2018, which claims the priority of German patent application 102017117540.7, filed Aug. 2, 2017, each of which is incorporated herein by reference in its entirety.

TECHNICAL FIELD

A light-emitting semiconductor chip is specified. Furthermore, a display element comprising a plurality of light-emitting semiconductor chips is specified.

SUMMARY

Embodiments provide a light-emitting semiconductor chip with improved optical properties and radiation characteristics. Further embodiments provide a display element having improved radiation characteristics.

The light-emitting semiconductor chip, for example, is an optoelectronic semiconductor chip which is configured to emit electromagnetic radiation. In particular, the light-emitting semiconductor chip is configured to emit light in a wavelength range visible to the human eye. For example, the semiconductor chip is formed by at least one semiconductor body, which is produced by an epitaxial process. In particular, the semiconductor chip may be formed with a plurality of semiconductor bodies. The semiconductor bodies can be produced in a common epitaxial process or in separate epitaxial processes.

According to at least one embodiment, the light-emitting semiconductor chip has an emission surface through which a majority of the light emitted by the semiconductor chip during intended operation leaves the semiconductor chip. For example, the emission surface is located on a main surface of the semiconductor chip. In particular, the emission surface may be formed by several semiconductor bodies. For example, the semiconductor bodies may each comprise a surface, wherein the surfaces of different semiconductor bodies are arranged next to each other in a first plane.

According to at least one embodiment, the emission surface is formed with a plurality of first emission regions and second emission regions. For example, a light-emitting semiconductor chip comprises at least two, in particular at least four, first emission regions. In addition, a semiconductor chip comprises at least two emission regions, in particular exactly two second emission regions. Alternatively, a semiconductor chip comprises at least four, in particular exactly four second emission regions. In particular, the number of first emission regions is greater than the number of second emission regions. The emission regions may be part of different semiconductor bodies. For example, each emission region is formed by exactly one semiconductor body. Alternatively, several emission regions can be formed with a common semiconductor body.

According to at least one embodiment, the first emission regions and the second emission regions are each configured to emit light of a predefinable color location. In particular, each emission region is configured to emit light from a predefinable color location independently of other emission regions. For example, the emission regions may be configured to emit electromagnetic radiation from the same color location. Alternatively, each emission region may comprise a first, a second and a third light source, each of which is configured to emit light of a different color location. In particular, by means of targeted control of the light sources, mixed light of a predefinable color location can be emitted by each emission region.

According to at least one embodiment, the first and second emission regions can be controlled separately from each other. Preferably, the color location of the light emitted by means of each emission region can be set independently of other emission regions. Furthermore, the luminance of the light emitted by each emission region is adjustable independently of other emission regions.

According to at least one embodiment, the first emission regions and the second emission regions are arranged next to one another in a first plane. For example, the first plane extends parallel to the main extension plane of the emission regions. In particular, the first plane is parallel to the main extension plane of the light-emitting semiconductor chip. For example, the distance between two adjacent emission regions along the first plane is a maximum of 50 μm inclusive, in particular a maximum of 5 μm inclusive. In particular, adjacent emission regions are arranged directly adjacent to each other.

According to at least one embodiment, all second emission regions form at least a part of an outer edge of the emission surface. In particular, each outer edge of the emission surface is formed at least partially by outer edges of second emission regions. The emission surface is a surface that has a contour that surrounds all emission regions of a semiconductor chip. The outer edges, for example, form parts of the contour. In particular, the entire contour is formed by outer edges of the emission surface. For example, the contour has the shape of a polygon. The polygon can have an inner angle that is greater than 18°. Furthermore, the emission surface can also have a contour with concave or convex curved outer edges. In particular, the contour can be oval or circular. For example, the contour is parallelogram-shaped or a rectangular, in particular a square.

According to at least one embodiment, first emission regions have a smaller extension than second emission regions along at least one direction that lies in the first plane. In particular, emission regions have a cross-sectional area in the emission surface, wherein the cross-sectional area of each of the second emission regions is larger than the cross-sectional area of each of the first emission regions. For example, the first emission regions each have the same cross-sectional area. In particular, the second emission regions each have the same cross-sectional area. In particular, the first emission regions are congruent with each other. Furthermore, second emission regions can be congruent with each other. The cross-sectional areas of the first and/or second emission regions can show for example a polygonal, in particular parallelogram-shaped and/or rectangular, contour in the first plane.

A semiconductor light-emitting chip described here is based, among other things, on the following considerations: By using an autostereoscopic display element, different perspectives of an image to be displayed are represented in spatially adjacent zones. For this purpose, emission regions of a light-emitting semiconductor chip can be used, which are imaged into the different zones by means of a suitable optical system, so that one emission regions of the light-emitting semiconductor chip serves to represent a pixel in a zone. The zones can have the same size if the emission regions have the same length along a corresponding direction in the emission surface. Furthermore, it is functional to provide emission regions of different sizes for zones of different sizes.

The light-emitting semiconductor chip described here makes use of the idea to arrange first emission regions and second emission regions next to each other in a first plane, wherein first emission regions have a smaller extension than second emission regions along at least one direction in the first plane. Advantageously, such a semiconductor chip shows an improved radiation characteristics. For example, such a semiconductor chip can be used in an autostereoscopic display element, where due to the different length of the first and second emission regions, the zones in which a perspective of an image is displayed each have different sizes.

According to at least one embodiment, the first emission regions form at least a part of two opposite outer edges of the emission surface. In particular, each first emission regions forms a part of two mutually opposite outer edges of the emission surface. For example, the emission surface has a rectangular contour or a parallelogram-shaped contour. Two opposite outer edges of the contour of the emission surface may, for example, be each formed with first and second emission regions. Two further opposite outer edges can be formed exclusively with second emission regions.

According to at least one embodiment, the emission surface is formed with third emission regions, wherein the second and third emission regions form all outer edges of the emission surface. In particular, the outer edges of the emission surface are formed exclusively by third emission regions. For example, the third emission regions have a greater length and width than the first emission regions along the first plane in at least one direction. Furthermore, third emission regions may have a greater width than second emission regions. In particular, second and third emission regions may have the same length. For example, the cross-sectional area of each third emission regions may be larger than the cross-sectional area of each first and second emission regions. In particular, the third emission regions are arranged in the area of the corners of the emission surface. For example, every third emission region borders on two outer edges of the emission surface. In particular, none of the outer edges of the emission regions is formed with the first emission regions.

According to at least one embodiment, first emission regions and second emission regions have the same width along at least one direction that lies in the first plane. In particular, the width is perpendicular to the length of the emission regions. For example, the first and second emission regions have a rectangular contour, wherein the rectangular contours of the first and second emission regions having the same width and a different length. Furthermore, third emission regions and second emission regions may have the same length and a different width along the first plane. In particular, third emission regions differ from first emission regions in their width and in their length along the first plane.

According to at least one embodiment, the first and second emission regions are arranged at the nodes of an irregular lattice in the first plane. The term irregular lattice is used here for a rectangular lattice or a lattice formed by parallelograms or hexagons. In particular, the lattice can be formed by at least two sets of parallel straight lines, wherein the straight lines of at least one set are not equidistant to each other. For example, distances between adjacent lines of a common set can vary sinusoidally. The emission regions are arranged in such a way that corresponding points of the individual emission regions lie on the nodes of this lattice, i.e., the intersection points of the straight lines. In particular, the first, second and third emission regions are arranged in the first plane at the nodes of an irregular rectangular lattice.

For example, the emission regions are arranged directly adjacent to each other. For example, the first, second and third emission regions are arranged at regular distances from each other.

According to at least one embodiment, the first and second emission regions are each configured to emit light in the red, green and blue wavelength range. In particular, the third emission region is configured to emit light in the red, green and blue wavelength range. For example, the emission regions are configured to emit mixed light of a given color location. For example, the first light source is configured to emit light in a red wavelength range, the second light source is configured to emit light in a green wavelength range, and the third light source may be configured to emit light in a blue wavelength range. By separately controlling the first, second and third light sources, the brightness and color location of the mixed light of the light sources emitted from each emission region are adjustable.

For example, the light sources may be formed with different semiconductor bodies. Alternatively, the light sources can be part of a common semiconductor body in which electromagnetic radiation is generated in a first wavelength range. For example, different conversion materials, by means of which part of the electromagnetic radiation generated in the semiconductor body is converted into electromagnetic radiation of a further wavelength range, can be subordinated to the semiconductor body. Thus, by means of partial conversion of the electromagnetic radiation generated in the semiconductor body, it is possible to generate light from a predefinable color location, which is emitted from each emission region.

According to at least one embodiment, the first and second emission regions emit light of the same color location and luminance. In particular, light of the same color location and luminance can be emitted from all emission regions.

Furthermore, a display element is specified. For example, the display element may be part of a smartphone, a television, or a video wall. In particular, the display element is an autostereoscopic display element. With the autostereoscopic display element, for example, an image can be displayed three-dimensionally to an observer, wherein the observer can perceive the three-dimensional display with the naked eye, i.e., without an aid such as polarization or shutter glasses.

For example, the display element comprises an image region in which the representation of the image can be perceived by the observer. The image region can be divided into several zones, wherein a perspective of the image can be displayed in each zone by means of the display element. If an observer observes a different zone on one eye than on the other eye, the observers observes two different perspectives of the displayed image, so that a three-dimensional image impression is created for the observer.

According to at least one embodiment, the display element comprises a plurality of light-emitting semiconductor chips, wherein the light-emitting semiconductor chips are arranged side by side in the first plane at the nodes of a regular rectangular lattice. For example, the first plane is parallel to the emission surface of the semiconductor chips. In particular, all semiconductor chips have the same geometry and/or arrangement of first and second, and especially third, emission regions. For example, the emission regions of different semiconductor chips are congruent. In particular, the semiconductor chips are identical in construction. For example, the semiconductor chips are arranged on a common carrier. In particular, the semiconductor chips can be arranged directly adjacent to each other on the carrier.

According to at least one embodiment, an optical element is arranged downstream of the light-emitting semiconductor chips in a radiation direction. The optical element is, for example, a lens or an array of lenses arranged parallel to the first plane. In particular, the optical element can be formed by a plurality of cylindrical lenses. For example, several emission regions are assigned to a common cylindrical lens. Alternatively, each semiconductor chip can be assigned exactly one lens of the lens array. In particular, exactly one lens of the lens array can be assigned to each emission region.

According to at least one embodiment, the optical element directs the light emitted by the semiconductor chips into an image region having a plurality of first zones and a plurality of second zones. For example, the image region is subordinate to the display element in the radiation direction. In particular, an image displayed by the display element is perceptible to an observer in the image region. In particular, the display element has an image region of at least 100°, in particular of at least 150°. The image region can be divided into several first and second zones which, for example, are arranged next to each other at a predetermined minimum distance from the display element. For example, the minimum distance is at least 5 m, in particular at least 1 m, preferably at least 20 cm.

According to at least one embodiment, the optical element directs light emitted from first emission regions predominantly into at least some of the first zones and light emitted from second emission regions predominantly into at least some of the second zones. For example, the optical element directs light from third emission regions into third zones predominantly, in particular exclusively. For example, the optical element assigns the light of the emission regions of a semiconductor chip to different zones. In particular, the optical element unambiguously assigns the light of each emission region to a zone in the image region. Furthermore, the optical element can be used to direct the electromagnetic radiation emitted by the emission region to a predetermined position within the zone assigned to the respective emission region.

For example, the image region comprises as many zones as each semiconductor chip of the display element comprises emission regions. In particular, each emission regions represents exactly one pixel of the image in a zone. Furthermore, a semiconductor chip can be configured to display one pixel in each zone. In particular, the optical element assigns light emitted by emission regions of different semiconductor chips to the same zones. For example, the optical element directs the electromagnetic radiation emitted by emission regions of different semiconductor chips to a given position within the zone assigned to the respective emission regions.

Advantageously, an image can be displayed in each zone of the image region by means of the display element, wherein a different image can be displayed in each zone by means of separate control of the emission regions. Thus, a different perspective of an image can be displayed in each zone by means of the display element, so that a three-dimensional image impression is created for an observer by simultaneous perception of the image in two different zones. The size of the first zones is smaller than the size of the second zones, since the first emission regions have a shorter length than the second zones along the first plane. Thus, the image region can be divided into first and second zones in such a way that an observer can only perceive light from a second zone at a given distance and at a given position in the image region and thus only perceive a two-dimensional representation of the image. The display element thus has a particularly advantageous radiation characteristic, in which the size of the zones in the image region can be specified by dimensioning the emission regions. In particular, the zones of the display element can be arranged in such a way that an observer at the edge of the image region only perceives a two-dimensional representation of the image, since, for example, the observer perceives the image of an identical zone with both eyes. Furthermore, the zones of the display element can be arranged in such a way that an observer perceives a three-dimensional representation of the image in the central part of the image region, since the observer perceives with both eyes the representation of the image in two different zones, in which the image is displayed in two different perspectives.

According to at least one embodiment, an image is displayable by means of the emission regions assigned to a common zone. For example, the optical element directs light from different emission regions of different semiconductor chips to a given position in each zone. Thus, an image is displayable in this zone by selectively controlling the emission regions assigned to a common zone. Advantageously, a different perspective of the image can be displayed within each zone of the image region. Thus, for an observer who perceives two different zones simultaneously, a three-dimensional image impression can be generated in the image region.

According to at least one embodiment, different perspectives of an image are displayable in different zones by means of the display element, wherein the simultaneous perception of different perspectives causes a three-dimensional image impression. For example, the simultaneous perception of the image displayed in two adjacent zones creates a three-dimensional image impression.

According to at least one embodiment, the zones are arranged in such a way that at the edge of the image region an observer perceives exactly one represented perspective with both eyes at a predetermined distance from the display element in the image region, and in a central part of the image region an observer perceives two different represented perspectives with the eyes at the same predetermined distance from the display element in the image region. For example, the image region has a rectangular contour. Along the contour of the image region, the image region may have an edge in which the zones have a minimum extension of at least 10 cm, preferably at least 1 m, parallel to the emission surface. In particular, the zones have this minimum extension at a distance of at least 30 cm, in particular at least 1 m, from the display element. Thus, for example, the extent of the zones at the edge is greater than the distance between the eyes of an observer, so that both eyes of an observer can be within the same zone at the edge of the image region. In particular, only second and/or third zones are arranged at the edge of the image region.

The central part of the image region is surrounded by the edge in at least two directions parallel to the emission surface. In the central part of the image region, the zones may have a minimal extent parallel to the emission surface which is smaller than the minimal extent of the zones at the edge of the image region. In particular, the zones have this minimum extent at a distance of at least 30 cm, in particular at least 1 m, from the display element. Thus, for example, the extent of the zones in the central part is smaller than the distance between the eyes of an observer in the central part of the image region, so that both eyes of an observer in the central part of the image region can be located within different zones. In particular, the first zones are predominantly arranged in the central part of the image region.

Advantageously, the image region of a display element comprises an edge in which an observer can perceive a two-dimensional representation of an image, and a central part in which an observer can perceive a three-dimensional representation of an image.

According to at least one embodiment, the zones are arranged side by side in a first lateral direction, wherein the first lateral direction extends perpendicular to the radiation direction. In particular, the zones are arranged side by side exclusively in a first lateral direction. For example, the display element comprises exclusively light-emitting semiconductor chips in which the first and second emission regions are arranged next to each other in the first lateral direction. Advantageously, such a display element can be used to display different perspectives of an image along the first lateral direction.

According to at least one embodiment, the zones are arranged side by side in a second lateral direction, wherein the second lateral direction extends perpendicular to the first lateral direction and perpendicular to the radiation direction. For example, the display element comprises exclusively light-emitting semiconductor chips in which the emission regions are arranged side by side along the first and second lateral directions. Advantageously, different perspectives of an image can be represented by means of such a display element along the first and second lateral directions.

According to at least one embodiment, the zones are arranged non-overlapping in the radiation direction at a distance of at least 30 cm from the display element. In particular, the zones are arranged non-overlapping at a distance of at least one meter, in particular at least 10 m, from the display element. For example, zones adjacent to one another are arranged directly adjacent to one another in the image region. Thus, each point within the image region can be clearly assigned a zone. Furthermore, the zones in the image region are arranged, for example, in such a way that an observer may predominantly perceive light from adjacent zones or from exactly one zone at a predetermined distance from the display element. Advantageously, such a display element makes it possible to create a three-dimensional or two-dimensional image impression for an observer.

According to at least one embodiment, each second zone has a second cross-sectional area orthogonal to the radiation direction which is larger than a first cross-sectional area of the first zones which is orthogonal to the radiation direction and at the same distance to the display element. In particular, the light from third emission regions is assigned to third zones, wherein the third zones have a larger third cross-sectional area than the second zones, wherein the third cross-sectional areas are orthogonal to the radiation direction. For example, the second zones are arranged exclusively at the edge of the image region. Furthermore, the first zones may be arranged between two second zones. In particular, all first zones may be arranged adjacent to at least one other first zone. In particular, the edge of the image region can be formed only with second and/or third zones. For example, the first zones in the image region are so large that an observer never perceives only a first zone. For example, an observer who perceives a first zone on one eye perceives another first zone, a second zone, or a third zone on the other eye. Furthermore, second and third cross-sectional areas can be so large at a given distance that only light from a second or third zone can be perceived by an observer with both eyes. Advantageously, the second and third zones allow an observer to see a two-dimensional representation of an image at the edge of the image region. Thus an incorrect three-dimensional representation of the picture is advantageously avoided in particular at the edge of the image region.

According to at least one embodiment, the first zones are arranged adjacent to each other in the first lateral direction in the image region. In particular, the first zones have an extent in the first lateral direction that exactly two first zones can be perceived simultaneously by an observer at a given distance from the display element. In particular, two first zones adjacent to each other can be perceived simultaneously by an observer. Advantageously, an image can be displayed from different perspectives in different first zones, so that an observer who perceives two different first zones receives a three-dimensional image impression.

According to at least one embodiment, the first zones in the image region are surrounded by second and/or third zones in lateral directions. For example, only second and/or third zones are arranged at the edge of the image region. In particular, the second and third zones are larger in lateral directions than the first zones. Advantageously an observer may perceive a two-dimensional representation of the image at the edge of the image region and may perceive a three-dimensional representation of the image in a central part of the image region.

BRIEF DESCRIPTION OF THE DRAWINGS

Advantageous embodiments and developments of the light-emitting semiconductor chip and the display element will become apparent from the exemplary embodiments described below in association with the figures.

In the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1A:
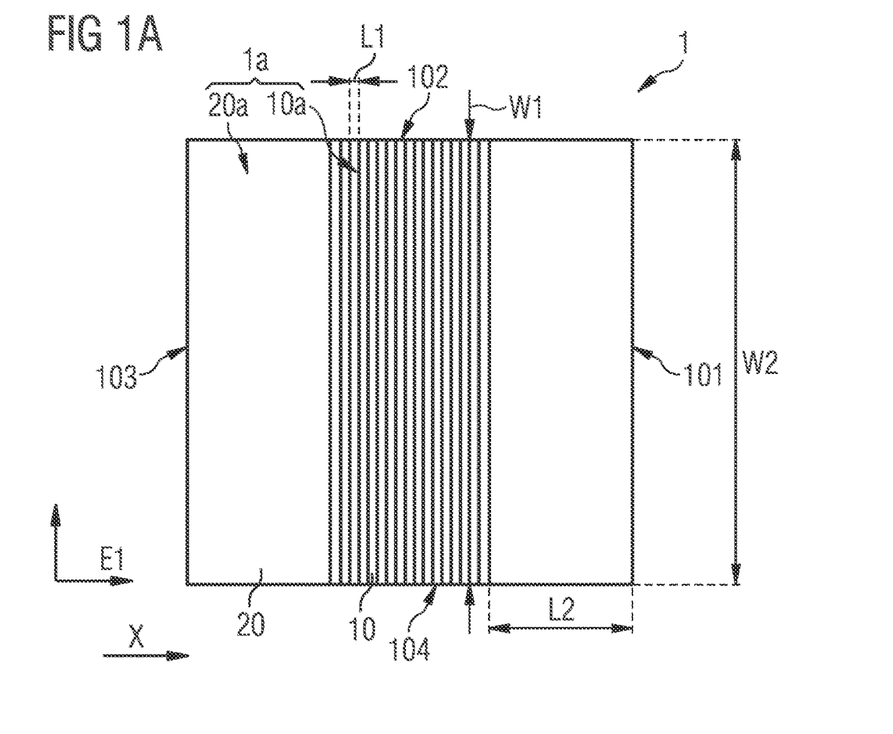
FIGS. 1A and 1B show schematic top views of the emission surface of embodiments of light-emitting semiconductor chips.

FIG. 1A shows a plan view of the emission surface 1a of a light-emitting semiconductor chip 1 according to an example. The emission surface 1a is formed by a plurality of first emission regions 10 and second emission regions 20. The first and second emission regions are arranged next to each other in a first lateral direction X. The first emission regions 10 and the second emission regions 20 are configured to emit light L of a predefinable color location. The first emission regions 10 and the second emission regions 20 can each be controlled separately. In particular, each emission region can be controlled individually. The first emission regions 10 and the second emission regions 20 are arranged next to each other in a first plane E1. All second emission regions 20 each form at least a part of an outer edge 101, 102, 103, 104 of the emission surface 1a. The first emission regions 10 are adjacent to each other and arranged between two second emission regions 20. In particular, the first emission regions 10 are surrounded by second emission regions 20 at least in two directions along the first plane E1. The first emission regions 10 form at least a part of two opposite outer edges 102, 104 of the emission surface 1a. In particular, the first 10 and second emission regions 20 are arranged directly adjacent to each other in the first plane E1.

The emission regions 10, 20 each have a rectangular cross-sectional area 10a, 20a. The emission regions 10, 20 form, for example, an emission surface 1a, which has a rectangular contour. Alternatively, the emission regions 10, 20 may each have a parallelogram-shaped cross-sectional area 10a, 20a. In particular, the emission regions 10, 20 can form an emission surface 1a with a parallelogram-shaped contour.

First emission regions 10 have a first length L1 along the first plane E1 in at least one direction. Second emission regions 20 have a second length L2 along the first plane E1. The first length L1 is shorter than the second length L2. First emission regions 10 have a first width W1 along the first plane perpendicular to the first length L1. Second emission regions 20 have a second width W2 along the first plane E1 perpendicular to the second length L2. The first width W1 and the second width W2 are equal.

By means of the first and the second emission regions 10, 20, light L in the red, green and blue wavelength ranges can be emitted. For example, each emission region comprises three light sources, each of which is configured to emit light in the red, green or blue wavelength range. The light sources of each emission region, for example, can be operated independently of each other, so that each emission region can emit 10, 20 mixed light with a predefinable color location. In particular, the first 10 and second 20 emission regions can be used to emit light L of a same color location and luminance.

Figure 1B:
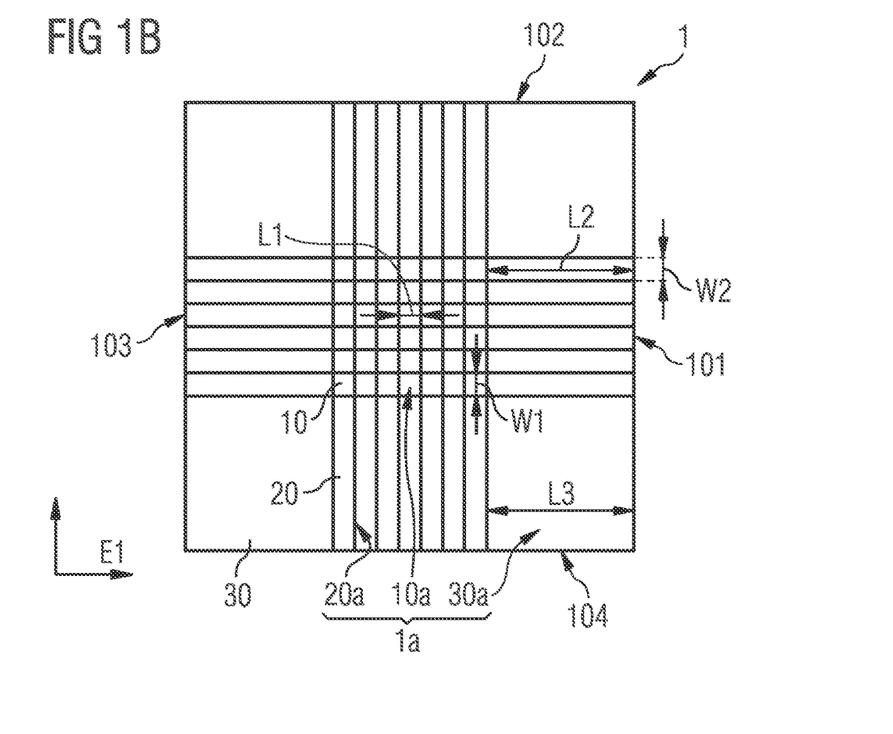

FIG. 1B shows a plan view of an emission surface 1a of a light-emitting semiconductor chip 1 described here according to an embodiment. In contrast to the example shown in FIG. 1A, the emission surface 1a is formed with third emission regions 30. The second 20 and third 30 emission regions form all outer edges 101, 102, 103, 104 of the emission surface 1a. The third emission regions 30 have a third width W3. The third width W3 is as long as the second length L2 of the second emission regions 20. The first 10, second 20 and third 30 emission regions each have a rectangular cross-sectional area 10a, 20a, 30a along the first plane E1. A second width W2 of the second emission regions 20 is as large as the first width W1 of the first emission regions 10 and the second length L2 of the second emission regions as large as the third length L3 of the third emission regions 30.

Furthermore, the third emission regions 30o each have a third cross-sectional area 30a, the second emission regions 20 each have a second cross-sectional area 20a and the first emission regions 10 each have a first cross-sectional area 10a. The second cross-sectional area 20a is larger than the first cross-sectional area boa and smaller than the third cross-sectional area 30a.

The first, second and third emission regions 10, 20, 30 are arranged in the first plane E1 at the nodes of an irregular rectangular lattice. The emission surface 1a comprises all first 10, second 20 and third 30 emission regions. In particular, the first, second and third emission regions 10, 20, 30 are arranged in such a way that the emission surface 1a has a rectangular, in particular square, contour within which all the emission regions lie. In particular, the contour of the emission surface 1a surrounds a single contiguous surface.

Figure 2A:
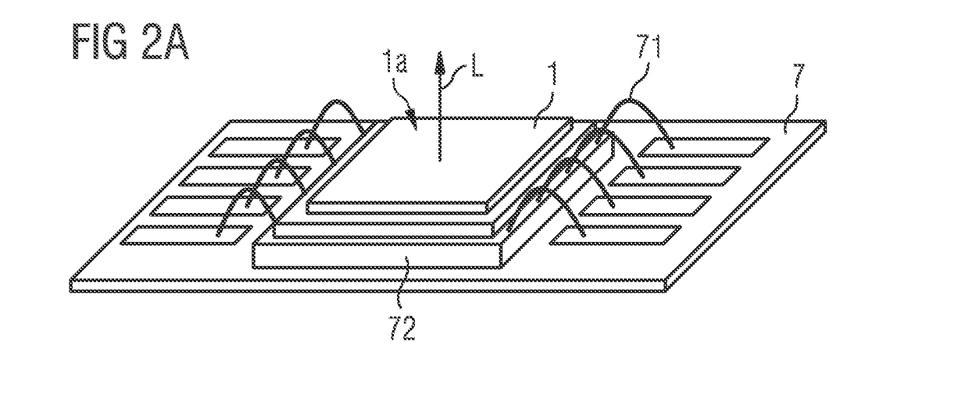
FIGS. 2A and 2B schematically show embodiments of light-emitting semiconductor chips.

FIG. 2A shows an example of a light-emitting semiconductor chip 1 arranged on a carrier 7. In particular, the light-emitting semiconductor chip 1 is mechanically fixed to the carrier 7. The carrier 7 comprises contacts 71, via which the light-emitting semiconductor chip is electrically conductively contacted and is supplied with current during normal operation. Furthermore, the carrier 7 may comprise a heat sink 72 on which the light-emitting semiconductor chip 1 is arranged. By means of the heat sink 72 heat that is generated during operation of the light-emitting semiconductor chip 1 is dissipated.

Figure 2B:
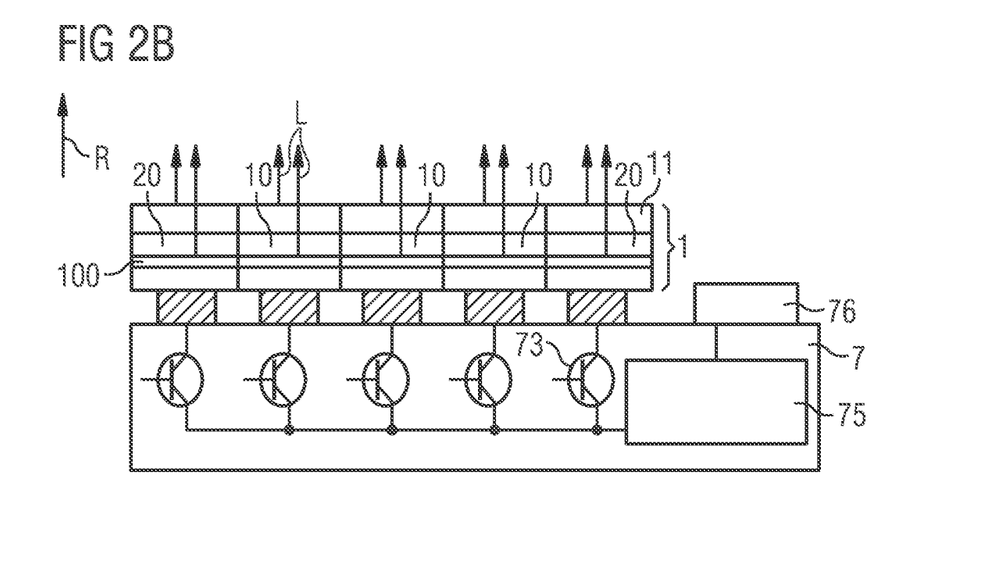

FIG. 2B shows a sectional view of an example of a light-emitting semiconductor chip 1 and a carrier 7. The light-emitting semiconductor chip 1 comprises first 10 and second 20 emission regions. The emission regions can be controlled and operated separately by means of a control unit 75 and transistors 73. For example, the emission regions 10, 20 comprise a common active region 100, which is configured to generate light during normal operation. In particular, the emission regions 10, 20 may be formed with a common semiconductor body, whereby the emission regions 10, 20 are produced in a common process. Alternatively, the emission regions 10, 20 may be formed by several semiconductor bodies manufactured in separate processes. The emission surface 1a of the light-emitting semiconductor chip 1 is formed by a converter 11, which is arranged downstream of the semiconductor body in a radiation direction R. The converter 11 is configured to convert at least a part of the light generated in the active region 100 into light of a longer wavelength range. Furthermore, a contact pad 76 is arranged on the carrier 7, by means of which the control unit 75 can be electrically contacted and operated.

Figure 3A:
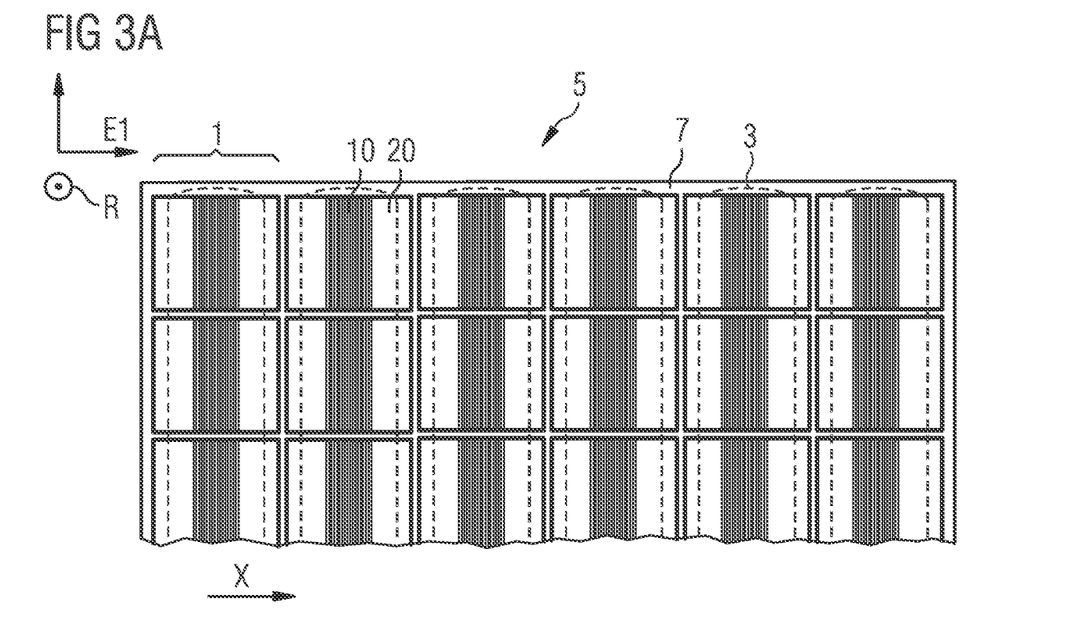
FIGS. 3A and 3B show schematic top views of embodiments of a display element.

FIG. 3A shows a plan view of an example of a display element 5 with a plurality of light-emitting semiconductor chips 1. The plurality of light-emitting semiconductor chips 1 is arranged in a first plane E1 next to each other at the nodes of a regular rectangular lattice. In particular, the light-emitting semiconductor chips 1 are semiconductor chips 1 as shown in the example in FIG. 1A. The semiconductor chips 1 are aligned in a same direction along the first plane E, so that the first emission regions 10 of different semiconductor chips 1 run parallel to each other. In particular, the semiconductor chips 1 can be arranged laterally spaced from each other in the first plane E1. Furthermore, second emission regions of 20 different semiconductor chips 1 run parallel to each other. The semiconductor chips 1 are arranged on a common carrier 7. In particular, the semiconductor chips can be operated separately from each other.

An optical element 3 is arranged downstream of the light-emitting semiconductor chips 1 in a radiation direction R. The light-emitting semiconductor chips 1 can be operated separately from each other. The optical element 3 comprises a plurality of cylindrical lenses which are arranged next to each other in a plane at regular intervals. In particular, several semiconductor chips 1 are assigned to each lens of the optical element. For example, the semiconductor chips 1 are arranged at the nodes of a periodic lattice, in particular rectangular lattice. In particular, the semiconductor chips 1, which are assigned to a common lens of the optical element 3, are arranged along a common column of the lattice. The optical element 3 directs the light of the semiconductor chips 1 into an image region B with several zones Z. The optical element 3 directs the light L of the semiconductor chips 1 into an image region B with first Z1 and second Z2 zones, wherein the optical element 3 directs predominantly light L of first emission regions 10 into each first zone Z1 and predominantly light L of second emission regions Z2 into each second zone Z2. The first zones Z1 and the second zones Z2 are arranged next to each other exclusively along a first lateral direction X, whereby the first lateral direction X is perpendicular to the radiation direction R.

Figure 3B:
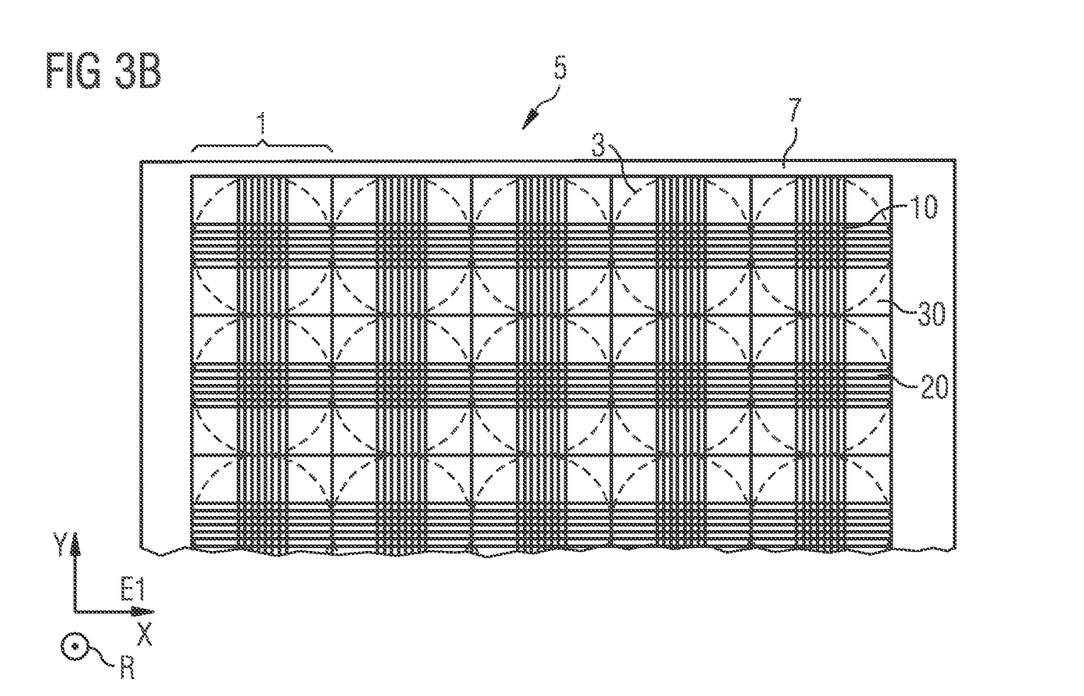

FIG. 3B shows a plan view of an example of a display element 5 with a plurality of light-emitting semiconductor chips 1. The plurality of light-emitting semiconductor chips 1 is arranged in a first plane E1 next to each other at the nodes of a regular rectangular lattice. Alternatively, the semiconductor chips 1 can be arranged at the nodes of a hexagonal lattice. Furthermore, the semiconductor chips 1 can be arranged next to each other in the first plane E1 at the nodes of an irregular lattice. For example, the distance between adjacent nodes in the first plane E1 of the irregular lattice can vary sinusoidally. In particular, the light-emitting semiconductor chips 1 are semiconductor chips 1 as shown in the example of FIG. 1B. In contrast to the example shown in FIG. 3A, the zones Z are arranged side by side in a first lateral direction X and a second lateral direction Y, wherein the second lateral direction Y extends perpendicular to the first lateral direction X and perpendicular to the radiation direction R.

Figure 4A:
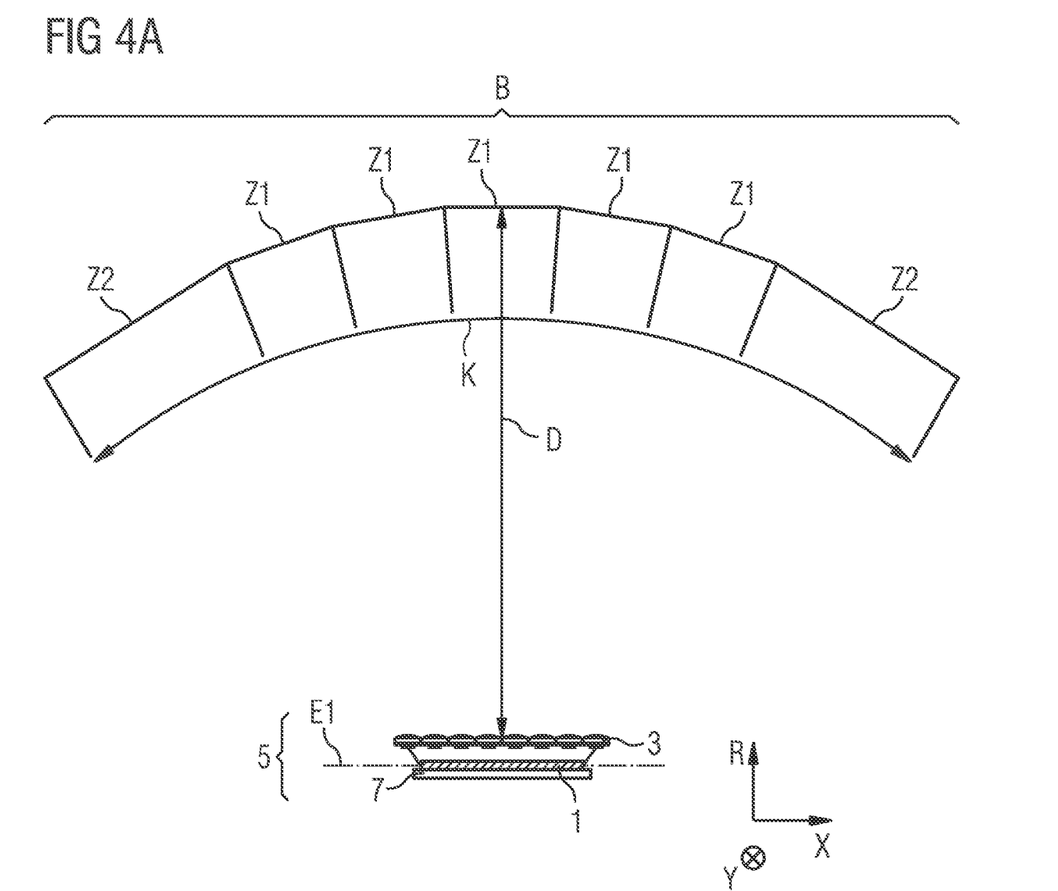
FIG. 4A shows a schematic sectional view of an execution example of an image region and a display element.

FIG. 4A shows a schematic sectional view of a display element 5 described here. The display element 5 comprises a plurality of light-emitting semiconductor chips 1 arranged side by side on a carrier 7 in a first plane E1. An optical element 3 is arranged downstream of the semiconductor chips 1 in the radiation direction, which directs at least a large part of the light emitted by the semiconductor chips into the image region B. The image region B is arranged at a distance D from the display element 5. For example, the distance is at least 30 cm, in particular at least 1 m. The image region comprises several first Z1 and second Z2 zones. Zones Z1, Z2 are arranged next to each other in a first lateral direction X. The first lateral direction X is perpendicular to the radiation direction R. In particular, the zones can also be arranged next to each other in a second lateral direction Y, whereby the second lateral direction Y extends perpendicular to the first lateral direction X and perpendicular to the radiation direction R. In particular, the zones Z1, Z2 are arranged non-overlapping with each other in the radiation direction R at a distance of at least 1 meter. Zones Z1, Z2 are preferably arranged non-overlapping with each other in the radiation direction R at a distance of at least 10 meters. In particular, the display element comprises an image region with an opening angle K of at least 100°, in particular at least 150°.

In particular, first zones Z1 are assigned predominantly, in particular exclusively, to light L from first emission regions 10. Furthermore, second zones are assigned predominantly, in particular exclusively, to light L from second emission regions 20. In particular, the second zones Z2 have a larger cross-sectional area than the first zones Z1. The cross-sectional area of zones Z is measured perpendicular to the radiation direction R. The cross-sectional area of zones Z2 is measured perpendicular to the radiation direction R. In image region B, the first zones Z1 are arranged adjacent to each other along the first lateral direction X. The first zones Z1 are located in the same direction as the first zones Z1. In particular, the first zones Z1 can also be arranged adjacent to each other in the second direction Y. The first zones Z1 can also be arranged adjacent to each other in the second direction Y.

By means of the first emission regions 10, which are assigned to a common first zone Z1, and by means of the second emission regions 20, which are assigned to a common second zone Z2, an image can be displayed in the corresponding zones Z1, Z2. For example, light of exactly one emission region 10, 20 of each semiconductor chip 1 of the display element 5 is directed into a zone Z by means of the optical element 3. For example, a different perspective of an image can be displayed in different zones Z. This creates a three-dimensional image impression for an observer in the image region B who perceives at least the image in two different zones Z1, Z2. If the zones Z are arranged next to each other along the first direction X in the image region, a three-dimensional image impression can be perceived by an observer in the image region B whose eyes are located next to each other along the first lateral direction X. If, in addition, different zones Z1, Z2, Z3 are arranged next to each other in the image region B along the second lateral direction Y, a three-dimensional image impression can be perceived by an observer whose eyes are next to each other along the second lateral direction Y.

Figure 4B:
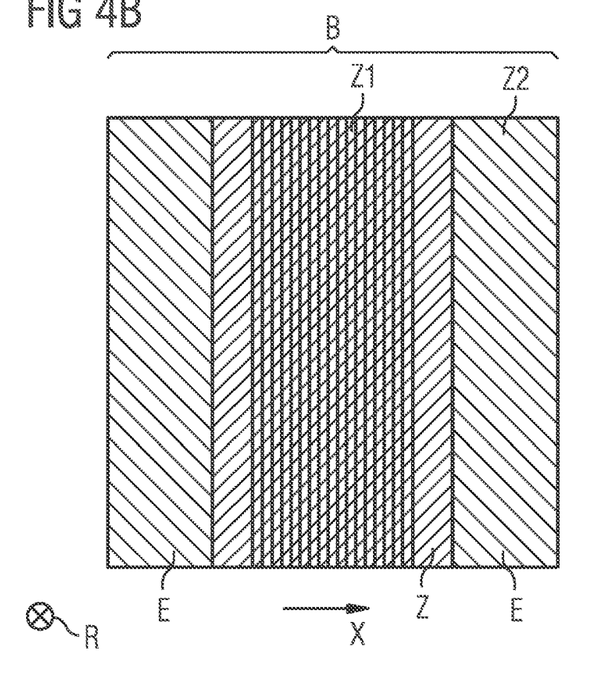
FIGS. 4B and 4C show schematic top views of embodiments of image regions of a display element.

FIG. 4B shows the plan view of an image region B of an example of a display element 5. In the image region, the zones Z are arranged next to each other along a first lateral direction X. In particular, each zone Z in the image region B can display exactly one perspective of an image. An observer whose eyes are located in different zones Z thus perceives two different perspectives of the picture, so that a three-dimensional image impression results for the observer. A display element 5, which is formed with semiconductor chips 1, in which the emission regions 10, 20 are arranged next to each other exclusively along the first lateral direction X, has an image region B, in which the zones Z1, Z2 are also arranged next to each other along the first lateral direction X. In particular, the image region B may show a barrel-shaped or a cushion-shaped distortion.

The zones Z are arranged in such a way that at the edge E of the image region B an observer at a predetermined distance D from the display element 5 in the image region B perceives exactly one displayed perspective with both eyes and in a central part E of the image region B an observer at the same predetermined distance D from the display element 5 in the image region B perceives two different represented perspectives with the eyes. For example, the predetermined distance D is at least 30 cm, in particular at least 1 m. In particular, the specified distance D is at most 500 m.

Figure 4C:
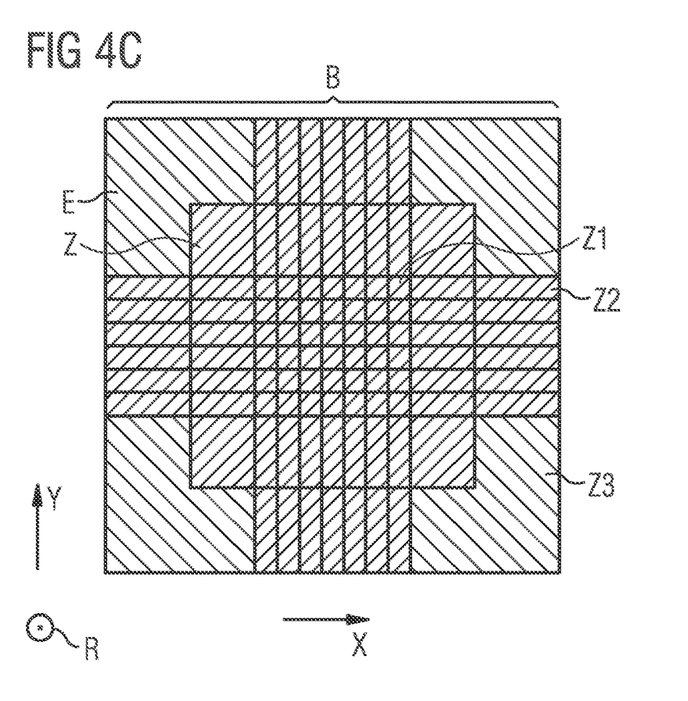

FIG. 4C shows the plan view of an image region B of an example of a display element 5. In contrast to the image region shown in FIG. 4B, the zones Z1, Z2 and Z3 are arranged next to each other along a first direction X and along a second direction Y. In particular, first zones Z1 are completely surrounded by second Z2 and/or third Z3 zones in lateral directions X, Y. In particular, the second zones Z2 and the third zones Z3 surround the first zones Z1 in the image region. For example, the image region B has a rectangular, in particular square contour. The third zones Z3 are arranged in each case in the corners of image region B The second zones Z2 are arranged between the third zones Z3 along the edges of the image region B.

For an observer whose eyes are located in image region B, a three-dimensional image impression is perceptible when the observer's eyes are located in different zones Z, and different perspectives of the image are represented in the different zones Z. At the edge of the image region, the display element 3 has zones Z with a larger cross-sectional area than in the center of the image region B. Thus, for an observer at the edge of the image region B, only the displayed perspective from one zone is perceptible with both eyes, so that a two-dimensional image impression is created for the observer.

The invention is not restricted to the exemplary embodiments by the description on the basis of the exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A light-emitting semiconductor chip comprising:
   an emission surface formed with a plurality of first emission regions and second emission regions,
   wherein the first emission regions and the second emission regions are configured to emit light of a predeterminable color location,
   wherein the first and second emission regions are separately controllable from each other,
   wherein the first and second emission regions are arranged next to one another in a first plane,
   wherein all second emission regions form at least a part of an outer edge of the emission surface such that each outer edge of the emission surface is formed at least partially by the second emission regions,
   wherein the first emission regions have a smaller extent than the second emission regions along at least one direction lying in the first plane, and
   wherein a contour of the emission surface is entirely formed by the outer edges of the emission surface.

2. The light-emitting semiconductor chip according claim 1, wherein the first emission regions form at least a part of two opposite outer edges of the emission surface.

3. The light-emitting semiconductor chip according to claim 1, wherein the emission surface further comprises third emission regions, and wherein the second and third emission regions all form the outer edges of the emission surface.

4. The light-emitting semiconductor chip according to claim 1, wherein the first and second emission regions have an equal width along at least one direction lying in the first plane.

5. The light-emitting semiconductor chip according to claim 1, wherein the first and second emission regions are arranged in the first plane at nodes of an irregular rectangular lattice.

6. The light-emitting semiconductor chip according to claim 1, wherein the first and second emission regions are each configured to emit light in a red, green and blue wavelength range.

7. The light-emitting semiconductor chip according to claim 1, wherein the first and second emission regions are configured to emit light of the same color location and the same luminance.

8. A display element comprising:
   a plurality of light-emitting semiconductor chips,
   each light-emitting semiconductor chip comprising an emission surface formed with a plurality of first emission regions and second emission regions,
   wherein the first emission regions and the second emission regions are configured to emit light of a predeterminable color location,
   wherein the first and second emission regions are separately controllable from each other,
   wherein the first and second emission regions are arranged next to one another in a first plane,
   wherein all second emission regions form at least a part of an outer edge of the emission surface, and
   wherein the light-emitting semiconductor chips are arranged side by side in the first plane at nodes of a regular rectangular lattice; and
   an optical element arranged downstream of the light-emitting semiconductor chips in a radiation direction,
   wherein the optical element is configured to direct the light emitted from the semiconductor chips into an image region having a plurality of first zones and a plurality of second zones, and
   wherein the optical element is configured to direct light emitted by first emission regions predominantly into at least some of the first zones and is configured to direct light emitted by second emission regions predominantly into at least some of the second zones.

9. The display element according to claim 8, wherein the emission regions assigned to a common zone are configured to display an image.

10. The display element according to claim 8, wherein different perspectives of an image are displayable in different zones, and wherein a simultaneous perception of different perspectives causes a three-dimensional image impression.

11. The display element according to claim 10, wherein the zones are arranged in such a way that an observer looking at the display element at an outer edge of the image region perceives exactly one represented perspective with both eyes at a predetermined distance from the display element in the image region, and an observer looking at the display element in a central part of the image region perceives two different represented perspectives with the eyes at the same predetermined distance from the display element in the image region.

12. The display element according to claim 8, wherein the zones are arranged side by side in a first lateral direction, and wherein the first lateral direction extends perpendicularly to the radiation direction.

13. The display element according to claim 12, wherein the zones are arranged side by side in a second lateral direction, and wherein the second lateral direction extends perpendicular to the first lateral direction and perpendicular to the radiation direction.

14. The display element according to claim 8, wherein the zones are arranged non-overlapping in the radiation direction at a distance of at least 30 cm from the display element.

15. The display element according to claim 8, wherein each second zone has a second cross-sectional area orthogonal to the radiation direction which is larger than a first cross-sectional area of the first zones at the same distance to the display element.

16. The display element according to claim 8, wherein, in the image region, the first zones are arranged adjacent to one another in a first lateral direction.

17. The display element according to claim 8, wherein, in the image region, the first zones are surrounded by at least some of the second zones in a first direction and in a second direction.

* * * * *